United States Patent [19]
Horiuchi et al.

[11] Patent Number: 5,683,791
[45] Date of Patent: *Nov. 4, 1997

[54] CERAMIC OXIDE CIRCUIT BOARD

[75] Inventors: Michio Horiuchi; Yoichi Harayama, both of Nagano, Japan

[73] Assignee: Shinko Electric Industries, Co., Ltd., Nagano, Japan

[*] Notice: The term of this patent shall not extend beyond the expiration date of Pat. No. 5,604,018.

[21] Appl. No.: 689,692

[22] Filed: Aug. 13, 1996

Related U.S. Application Data

[63] Continuation of Ser. No. 265,028, Jun. 24, 1994, Pat. No. 5,604,018.

[30] Foreign Application Priority Data

Jun. 25, 1993 [JP] Japan .................... 5-155176

[51] Int. Cl.$^6$ .................... B32B 3/00; B32B 15/00; H05K 1/03
[52] U.S. Cl. .................... 428/210; 428/209; 428/432; 428/901; 174/256
[58] Field of Search .................... 428/209, 210, 428/325, 432, 901; 174/256

[56] References Cited

U.S. PATENT DOCUMENTS

| | | | |
|---|---|---|---|
| 4,540,621 | 9/1985 | Eggerding et al. | 428/209 |
| 4,770,953 | 9/1988 | Horiguchi et al. | 428/209 |
| 4,897,509 | 1/1990 | Holleran et al. | 428/901 |
| 4,992,399 | 2/1991 | Kumagai et al. | 428/901 |
| 5,004,640 | 4/1991 | Nakatani et al. | 428/901 |
| 5,063,121 | 11/1991 | Sato et al. | 428/209 |
| 5,229,213 | 7/1993 | Horiuchi et al. | 428/457 |

*Primary Examiner*—Cathy F. Lam
*Attorney, Agent, or Firm*—Staas & Halsey

[57] ABSTRACT

Internal wiring made of copper of low-resistance is provided in a ceramic oxide. Green sheets 10 made of oxide powder are provided with plane wiring 18 and/or via wiring 14 in which copper is used as wiring material. The green sheets 10 are laminated and integrated in such a manner that the wiring portions 4 and 18 are covered with the green sheet so as not to be exposed onto a surface. Then the laminated body is fired at a maximum temperature in a range from 1,083° to 1,800° C.

2 Claims, 4 Drawing Sheets

CERAMIC OXIDE CIRCUIT BOARD

This applications is a continuation of application Ser. No. 08/265,028, filed on Jun. 24, 1994, U.S. Pat. No. 5,604,018.

BACKGROUND OF THE INVENTION

1. Field of the Invention

The present invention relates to a ceramic oxide circuit board onto which semiconductor elements are assembled, and also relates to a manufacturing method thereof.

2. Description of the Related Art

As the processing speed of semiconductor devices has increased recently and the semiconductor devices have become highly integrated, various characteristics are required of circuit boards and semiconductor packages so as to meet these demands. Concerning the electric characteristics, the bulk resistance of the conductor material and the dielectric constant of the insulating base material are important. For example, most of the loss caused in a transmission line is conductor loss and dielectric loss. In general, the amount of radiation loss is very small. A reduction in signal transmission speed is increased by the electrostatic capacity of the wiring and the electric resistance of the wiring material. Due to the above factors, the waveform of a signal to be transmitted is distorted, and a delay may reach a threshold value, which causes a delay in signal transmission. Accordingly, in order to prevent the distortion of transmitted waves, it is necessary to reduce the electrostatic capacity around the wiring, that is, it is necessary to reduce the dielectric constant around the wiring, and it is also necessary to reduce the electric resistance of the wiring material. When a DC resistance component of the wiring material is reduced, the characteristic impedance can also be reduced. Therefore, it is necessary to reduce the DC resistance component of the wiring material from the viewpoint of reducing reflection losses and insertion losses at wiring connectors by adjusting the characteristic impedance. From the reasons described above, in the field of optical communication in which communication is conducted at high speed using high frequency, it is strongly required to reduce the conducting resistance.

Concerning the ceramic material used for circuit boards or packages, alumina ceramics has been most commonly used. A high melting point metal such as tungsten or molybdenum has been used for the simultaneously fired metalizing material that is formed into metallic wiring. The reason why tungsten or molybdenum has been used for the simultaneously fired metalizing material is described as follows:

Generally, the firing temperature of aluminum ceramics is high, and it is not lower than 1,500° C. Therefore, in order to prevent the metalizing material from being melted or vaporized in the process of firing, or in order to prevent the metalizing material from reacting with the components of ceramics, a metallic material is used, the melting point of which is higher than the simultaneously firing temperature. The melting point of W is about 3,380° and that of Mo is about 2,620° C.

Electrical resistivity of the metallic wire obtained by means of simultaneous firing tends to be higher than the original specific resistance of the metal. For example, the specific resistance of tungsten is $5.6 \times 10^{-6}$ $\Omega$cm, however, the electrical resistivity of tungsten wiring provided by means of simultaneous firing with an aluminum ceramic is $15 \times 10^{-6}$ to $20 \times 10^{-6}$ $\Omega$cm. The reason for this is that the electrical resistivity of metallic wiring is affected by impurities included in tungsten and also affected by the amount of compaction of the sintered tungsten.

Compared with a high melting point metal such as tungsten or molybdenum, the specific resistance of a low melting point metal such as copper or gold is low. For example, the specific resistance of copper is $1.7 \times 10^{-6}$ $\Omega$cm, which is not more than ⅓ of that of tungsten. A technique is well known in which wiring made of low resistance metal is formed on a substrate of aluminum ceramics by means of after-firing.

In this case, after-firing is defined as follows:

A base board of an aluminum ceramic is provided when it is fired at a temperature not less than 1,500° C. On the thus obtained base board of an aluminum ceramic, a paste is printed, which paste primarily includes the low resistance metal. After that, the base board is heated to a temperature not higher than the melting point of the metal. Specifically, the base board is heated to a temperature of from 900° to 1,000° C. so that the metal can be densified. For example, the electrical resistivity of wiring made of copper provided in the manner described above is not more than $3 \times 10^{-6}$ $\Omega$cm, which is different from simultaneously fired tungsten, the resistance of which is increased by several times with respect to the original specific resistance. In the manner described above, on the surface of a base board made of an aluminum ceramic which is fired at a temperature of 1,500° C., wiring of a low resistance metal such as copper can be formed. However, in order to form highly integrated wiring, it is necessary to provide internal metalization, which can be formed, only by means of simultaneous firing.

Therefore, the following technique has been developed:

A ceramic composition which can be densified even at a low temperature is employed, and the ceramic is fired simultaneously with a low melting point metal such as copper.

The ceramics having the composition described above is generally referred to as low temperature fired ceramics. Concerning the composition of the low temperature fired ceramics, there are provided two types. One is a type in which the low temperature fired ceramic primarily includes crystallized glass, and the other is a type in which ceramics primarily includes glass capable of being sufficiently fluidized at a temperature not higher than 1,000° C., and ceramic powder such as aluminum and mullite. Since the latter is generally used, it is referred to as glass-ceramic composite ceramics. For example, the composition of this glass-ceramic composite ceramics is described as follows:

At least one of the high melting point oxides selected from alumina, mullite, silica and others, and glass powder of boro-silicate glass capable of sufficiently fluidized at 1,000° C. are mixed by a volumetric ratio of 1:1. Due to the foregoing, the ceramic base board can be simultaneously fired while the internal wiring is made of the low resistance metal described above.

However, various problems may be encountered in the case of the aforementioned glass-ceramic composite ceramic which is different from conventional ceramic in which alumina is fired at high temperature.

One of the problems relates to the characteristics of this compound ceramic. Specifically, the heat conductivity is remarkably low, the mechanical strength is low, and the dielectric loss factor is high.

The heat conductivity varies according to the composition. Since the compound ceramic includes glass, the heat conductivity of which is essentially low, the heat conductivity of the composite ceramics is generally 1 to 3 $wm^{-1}k^{-1}$, which is remarkably lower than that of the common ceramics. For example, when a comparison is made between the compound ceramic and alumina, the heat conductivity of alumina is 15 to 30 $wm^{-1}k^{-1}$, that is, the heat conductivity of the composite ceramics is about 1/10 of that of alumina. The low heat conductivity of the composite ceramic becomes a problem when it is assembled to a compact and high-output semiconductor device. The strength of the composite ceramic measured by a bending test is generally 20 $kgfmm^{-2}$, which is lower than that of alumina ceramic, wherein the strength of an alumina ceramic is 30 to 40 $kgfmm^{-2}$. Therefore, the use of the composite ceramics is limited. Concerning the electric characteristics, the dielectric constant of the composite ceramics is low. From this point of view, the composite ceramic is superior to aluminum ceramics. However, the dielectric loss factor of the composite ceramics, which will be important at a high frequency, is 20 to $40\times10^{-4}$ (at 1 MHz). On the other hand, the dielectric loss factor of alumina ceramic is generally $5\times10^{-4}$ (at 1 MHz). That is, the composite ceramics is inferior to aluminum ceramics. Concerning the manufacture of a composite ceramic, it is difficult to remove binder from the composite ceramics in the process of manufacture as follows. That is, in the case where the ceramic is fired simultaneously with copper, it is necessary to burn it in a non-oxidizing atmosphere so as to suppress the oxidization of copper. At this time, the organic components tend to remain in the composite ceramic. Before the organic components are removed from the system, the composite ceramic starts to densify, so that the organic components are left in the fired body in the form of carbon. As a result, various characteristics of the fired body, especially the electric characteristics, are remarkably deteriorated by the residual carbon.

A means for preventing the above deterioration, in which moist gas is used for the firing atmosphere is well known. However, according to the above means, it takes time to raise the temperature, so that the productivity is low, and further the quality of the composite ceramic is affected by any fluctuation in manufacturing process. Accordingly, the yield is low. Depending on the composition of glass used for the fired body, the ceramic generally starts softening at a temperature of 500° C. Consequently, conventional manufacturing processes, the temperature of which is higher than about 500° C., cannot be adopted. For example, a silver-soldering process for soldering pins and seal rings at 800° to 900° C. cannot be adopted.

SUMMARY OF THE INVENTION

It is an object of the present invention to provide a ceramic circuit board, and a manufacturing method thereof, by which the internal wiring thereof can be made of copper with a low electric resistance.

In order to accomplish the above object, the present invention provides a ceramic circuit board comprising: an insulating substrate made of ceramic; and a conductor circuit formed on the insulating substrate, wherein at least a conductor in the conducting circuit provided in the insulating base board is made of copper, and the conductor circuit is formed together with the ceramic by means of simultaneous firing.

The manufacturing method comprises the steps of: providing plane wiring and/or via wiring on green sheets made of oxide powder, wherein copper is used for the wiring material; laminating and integrating the green sheets into one body, wherein the wiring portion is covered with the green sheet so that the wiring portion is not exposed onto the surface; and firing the green sheets at a maximum temperature in a range from 1,083° to 1,800° C.

The oxide ceramic is primarily composed of one of alumina ($Al_2O_3$), mullite ($3Al_2O_3 \cdot 2SiO_2$) and cordierite ($2MgO \cdot 2Al_2O_3 \cdot 5SiO_2$). Specifically, examples of usable ceramic oxides are: very pure alumina ceramic, the fineness of which is not less than 99%; alumina ceramic, the fineness of which is 90 to 97%, frequently used for a base plate and package material; mullite ceramic including several percent of a sintering assistant; mullite ceramic including $SiO_2$ disclosed in Japanese Unexamined Patent Publication No. 1-317164, wherein the amorphous phase of $SiO_2$ is lower than 50%; compound ceramic of mullite and alumina; cordierite ceramic; and compound ceramic of cordierite and mullite.

In the case where the above ceramic oxides and copper are simultaneously fired, copper is melted and liquidized at a temperature not higher than 1,083° C. On the other hand, in general, ceramic oxide is not densified at this temperature. In order to sufficiently densify the ceramic oxide, it must be fired at a temperature higher than 1,083° C. by several tens to several of hundreds of degrees. Therefore, the following problems may be encountered.

(1) A chemical reaction may be caused between molten copper and the primary component of ceramic oxide or the auxiliary assistant component.

(2) Penetration of molten copper into the particles of ceramic oxide by capillary action.

(3) Vaporization loss of molten and liquidized copper.

(4) Diffusion of copper into the ceramic oxide.

(5) Dissolution of the principle component of ceramic oxide and the auxiliary assistant component into molten copper.

(6) Stress generated by a difference of the thermal expansion coefficient between copper and ceramic oxide.

(7) Difference, of volumetric change during the overall process, between copper and ceramic oxide.

Concerning item (1) relating to the chemical reaction between molten copper and the primary component of ceramic oxide or the auxiliary assistant component, specifically, $CuAl_2O_4$ and $CuAlO_2$ are known as possible results of chemical reactions between copper and the primary component of ceramic oxide. $CaCu_2O_3$, $Ca_2CuO_3$, $Ca_{1-x}CuO_2$ and $Cu_5Mg_2O_7$ are known as possible results of chemical reactions between copper and the auxiliary component.

Concerning item (2) relating to the penetration of molten copper into the particles of ceramic oxide by the capillary effect, the penetration of molten copper is affected by the wettability of component particles of ceramic oxide with respect to molten copper. It is known that the wettability is correlated to the thermodynamic properties of metal and ceramics, and also related to the surface structure of a solid body. Specifically, the level of impurities and the atmosphere are related to the wettability, so that the actual phenomenon is very complicated.

Concerning item (3) relating to vaporization loss of molten and liquidized copper, consideration must be given to the vaporization loss on the basis of the well-known vaporization behavior of the molten metal.

Concerning item (4) relating to the diffusion of copper into ceramic oxide, the diffusion is concerned with the above various phenomena. Specifically, for example, when titanium is fired simultaneously with alumina ceramic, it can be clearly observed that titanium is diffused into aluminum ceramics. In the case of item (4), the diffusion of copper is a problem.

Concerning item (5) relating to the dissolution of the primary component of ceramic oxide and the auxiliary component of the assistant into molten copper, this dissolution is a phenomenon in which a solid is dissolved by a liquid. Chemical elements easily dissolved by copper are well known. Accordingly, there is a high possibility that the assistant components and other impurities are dissolved by copper as a solute.

Concerning item (6) relating to the stress generated by the difference in the thermal expansion coefficient between copper and ceramic oxide problems such as damage to the ceramics caused by the stress, cutoff of the conductor, and distortion of the sintered body are known. The thermal expansion coefficient of copper is approximately $17 \times 10^{-6}/°C$. On the other hand, the thermal expansion coefficient of alumina ceramic is approximately $7 \times 10^{-6}/°C$., that of mullite ceramic is approximately $4.5 \times 10^{-6}/°C$., that of mullite ceramic including not more than 50% of the amorphous phase of $SiO_2$ is approximately $3 \times 10^{-6}$ to $4.5 \times 10^{-6}/°C$., and that of cordierite is approximately $2.5 \times 10^{-6}/°C$., and that of the composite ceramic of cordierite and mullite is an intermediate value, in other words, the thermal expansion coefficient of the composite ceramics of cordierite and mullite is $2.5 \times 10^{-6}$ to $4.5 \times 10^{-6}/°C$. The above thermal expansion coefficients are values at a temperature in a range from the atmospheric temperature to 400° C. It can be considered that a difference between the thermal expansion coefficients in the firing process is approximately the same. However, the difference between the thermal expansion coefficients is not directly related to the intensity of stress and the occurrence of crack and cutoff. The reason is that copper is essentially a ductile metal, and the Young's modulus of copper is lower than that of the above ceramic oxides. Accordingly, the intensity of the stress is determined by the size of the wiring portion of copper, and the generation of stress can be neglected in the case where the width, length and thickness are smaller than a predetermined value.

Concerning item (7) relating to the difference of a volumetric change, during the overall process, between copper and oxide ceramic, the difference becomes a problem after copper has been liquidized. That is, at the temperature of 1,083° C. at which copper is liquidized, the oxide ceramic has not been sufficiently densified. Accordingly, in the case where the charging ratio of copper is low in the wiring portion at the green stage, voids are made in the copper wiring portion at the temperature of 1,083° C. After the ceramic oxide has been densified to a predetermined value, in the case where the charging ratio of copper is increased to a predetermined value in the copper wiring portion at the green stage, a surplus amount of copper is generated in the volume, so that stress is caused in both the molten copper and the ceramics. In order to avoid the occurrence of stress described above, it is necessary that the charging ratio of copper at the green stage satisfies the following expression.

[Charging ratio of copper]%=100%−[(Charging ratio of ceramics after firing)−(Charging ratio of ceramics at the green stage)]%

While consideration was given to the above various points, investigations were made. As a result, the following manufacturing method is employed in the present invention. The manufacturing method comprises the steps of: providing plane wiring and/or via wiring on green sheets made of a powder of an oxide such as alumina, mullite and cordierite, wherein copper is used for the wiring material; laminating and integrating the green sheets into one body, wherein the wiring portion is covered with the green sheet so that the wiring portion is not exposed onto the surface; and firing the green sheets at a temperature in a range from 1,083° to 1,800° C.

In this case, it is preferable that the copper material used for formation of the conductor circuit is as pure as possible. The reason is described as follows:

When copper includes a large amount of impurities, the melting point is generally lowered, so that a difference between the melting point and the temperature at which the ceramic oxide starts being densified, is made larger. The wettability of molten copper with respect to ceramic oxide powder is changed before the ceramic oxide powder starts to densify. Therefore, the molten copper easily penetrates into the ceramic oxide. Concerning the paste of which the primary component is copper powder, although a frit bond type and a chemical bond type of copper paste are available on the market, it is not preferable to use these types of copper paste.

For the purpose of appropriately increasing the speed of densification of oxide ceramic powder, the particle size of powder is preferably small, and it is preferable that the average particle size is not more than 2 μm. In order to reduce the interaction between the ceramic oxide and molten metal, it is preferable that the powder of ceramic oxide is as pure as possible. Organic binder, plasticizer and organic solvent are added to the powder to satisfy the above conditions. In general, a sintering assistant is added for the purpose of increasing the speed of densification and also for the purpose of lowering the temperature at which oxide ceramic powder starts to be densified.

Concerning the sintering assistant, at least 0.1 to 50 weight percent of one of the compounds of elements in the groups 2a and 3a in the periodic table and $SiO_2$ is added, and preferably 1 to 20 weight percent is added. Most commonly, these components are added in the form of oxide. More specifically, an assistant of ceramic oxide is preferably adopted. Examples of usable oxides are: MgO, CaO, $CaCO_3$, SrO, BaO, $Y_2O_3$, $La_2O_3$, CeO, $SiO_2$, $3MgO.4SiO_2$ (talc), and $Al_2O_3.2SiO_2$ (kaolin). When these oxides are used, there is no interaction with molten copper as long as they are fired under the conditions described later.

Slurry provided in the manner described above is formed into a green sheet by the doctor-blade method. In this case, the density of the green sheet is made as high as possible. The reason is as follows:

At a point of time when copper to be used as wiring material is melted, the powder of ceramic oxide surrounding the liquid metal is made more dense, so that copper can be prevented from moving in the oxide ceramic and, further, the compacting speed can be increased.

In order to increase the density of the green sheet, the amounts of binder and plasticizer are minimized so that the charging density of inorganic components is increased, and also inorganic powder in the slurry is highly dispersed, and further the casting speed and drying condition are adjusted.

On the green sheet provided in the manner described above, wiring in the plane direction and via wiring are made, or alternatively one of those wirings is made. In general, the wiring in the plane direction is made when a sheet of copper foil is adhered or copper paste is subjected to screen printing. On the other hand, the via wiring is made when a through-hole previously formed on the green sheet is charged with copper paste.

Next, these green sheets are laminated. On the surface of the plane wiring or via wiring portion, the green sheet is laminated so that the copper wiring is not exposed onto the surface of the laminated body. The laminated body is heated and pressurized so as to be integrated into one body, and when necessary, a solvent compatible with the organic components included in the green sheet is coated for integration. Concerning the heating and pressurizing conditions, in general, it is preferable that the temperature is not lower than 50° C. and the pressure is not lower than 100 kgf/cm$^2$.

After the binder has been removed from the laminated body in a non-oxidizing atmosphere, firing is conducted in the non-oxidizing atmosphere at a temperature in a range from 1,083° to 1,800° C. The most appropriate maximum temperature for firing depends on the type and composition of the ceramic oxide. For example, the most appropriate maximum temperature of firing the usual alumina ceramic, the fineness of which is 90 to 97%, is 1,500° to 1,600° C. The most appropriate maximum temperature for firing highly pure alumina ceramics, the fineness of which is not less than 99%, is 1,500° to 1,800° C. (In the case where ultra-fine powder is used, the most appropriate temperature is 1,300° to 1,500° C.) In the case of mullite ceramics, the fineness of which is 95 to 99% and to which MgO, $Y_2O_3$ and CaO are added, the most appropriate temperature is 1,450° to 1,600° C. In the case of mullite ceramics, the fineness of which is not less than 99%, the most appropriate maximum temperature is 1,550° to 1,700° C. In the case of mullite ceramic which includes 50 weight percent of $SiO_2$ amorphous phase, the most appropriate temperature is 1,200° to 1,600° C. depending on an amount of $Y_2O_3$ to be added. In the case of cordierite, the fineness of which is 80 to 99%, the most appropriate maximum temperature is in a range from 1,000° to 1,350° C. In the processes of binder removing and firing, the non-oxidizing atmosphere is used in order to prevent the oxidization of copper. Specifically, nitrogen gas or ammonia cracked gas is preferably used. In order to effectively remove the organic components, a moist atmosphere of one of the above gases is preferably used.

Depending on the conditions of processes for binder removing and firing, a phenomenon relating to the interaction between copper and ceramic oxide occurs. Specifically, the copper wiring portion turns reddish-brown. It is considered that the reason why the copper wiring portion turns reddish-brown is the diffusion of copper into the ceramic. It is thought that this phenomenon is caused as a result of interaction of copper, the atmosphere generated by the binder removing and firing processes, and oxide ceramic. This phenomenon occurs especially when only nitrogen gas of low purity is used, and when a moist atmosphere is used. In the case where a moist atmosphere is used, the above phenomenon depends on: the dew point; the maximum temperature at which the moist atmosphere is introduced; and the time the temperature is held. For example, even at the same dew point, when the moist atmosphere is introduced at a high temperature, the above phenomenon tends to occur. Even at the same dew point and the same maximum temperature, when the holding time at the temperature is long, the above phenomenon still tends to occur. Further, when the dew point is high, the above phenomenon still tends to be recognized. In the case where the maximum temperature is sufficiently low, the occurrence of the above phenomenon can be prevented. The most appropriate conditions must be determined in accordance with the type and amount of organic components included in the green sheet. Accordingly, it is difficult to simply determine the most appropriate combination of these three conditions. However, in the case where copper paste of which the average particle size is 1 to 2 µm is used, an example of the most commonly usable condition is as follows:

The dew point is not higher than 60° C., and the maximum temperature is not higher than 850° C. Pressure is maintained at 1 normal atmosphere, and the condition is held for not more than 2 hours.

According to the process and condition described above, a ceramic substrate including internal copper wiring can be provided. In the case of oxide ceramic having plane wiring, when the wiring length is especially long and copper paste is used for the formation of wiring, and also when the charging ratio of copper is low in the paste, the volume of copper is remarkably reduced in the process of firing, and the wettability of ceramic oxide with respect to molten copper is low. For this reason, the wiring is frequently cut off. In order to prevent the wiring from being cut off, it is effective that 0.1 to 5 weight percent of titanium is contained in the copper paste, or alternatively 10 to 50 volume percent of tungsten is contained in the copper paste. In the case where titanium is added to the copper paste, it may be added in the form of metallic oxide or other compounds. However, it is most preferable that titanium is added to copper paste in the form of metal. As described above, in order to prevent harmful interaction caused by copper and ceramic oxide, in general, it is not preferable that impurities are included in the copper. Therefore, it can be considered that the interaction is facilitated, for example, the melting point is lowered, when titanium is included in copper. However, according to the result of an investigation made by the present inventors, the following has been made clear:

Titanium is diffused into the ceramic oxide, however, copper is not diffused into the ceramic oxide.

However, when titanium is added, the conductor resistance is increased, and the dielectric constant of ceramic oxide around the conductor is increased, which is opposite to the object of the invention. Accordingly, the amount of titanium is maintained at not more than 5 weight percent. In order to prevent the wiring from being cut off, it is preferable that the addition amount of titanium is about 0.1 weight percent, which is the lower limit for preventing the wiring from being cut off. In the case where tungsten is added to copper paste, tungsten powder, the particle size of which is 1 to 20µ, is preferably used. In the combination of copper and tungsten, the mutual solubility is very low, and it can be estimated that tungsten seldom diffuses into ceramic oxide, and copper seldom diffuses into ceramic oxide. However, as the tungsten content is increased, the electric resistance of wiring is increased. Accordingly, the addition amount of tungsten is made as small as possible in the range in which the wiring can be prevented from being cut off.

Under the aforementioned conditions of temperature and others in the process of firing copper and tungsten, the mutual wettability is excellent, and when the fine structure is observed by a scanning type electron microscope, white tungsten particles are uniformly dispersed in the matrix of less-white molten copper. When the average particle size of tungsten powder to be added is small, vaporization of copper tends to be facilitated. Therefore, when the rate of temperature increase is greatly reduced in a period of time from the melting of copper to the start of compacting ceramic oxide, the sintered body of paste becomes very porous, like sponge. The reason is thought to be as follows:

The wettability of copper and tungsten is very high, so that the effective vaporization surface area is increased when tungsten is present.

When the thus obtained ceramic oxide substrate including the internal copper wiring is subjected to polishing or grinding, a portion of the conductor in the base board is exposed onto the surface. As the internal conductor, there are provided a wiring disposed in the plane direction and a via wiring. In many cases, an end surface of the via wiring is exposed onto the surface. Successively, surface wiring or a pad-shaped surface terminal is formed, to which a portion of the internal conductor exposed to the surface is connected. In this case, the thick film method or the thin film method is preferably adopted. In the thick film method, copper paste for post firing can be used and either the frit-bond type or the chemical-bond type may be adopted. This paste is screen-printed on the surface of the base board, and fired in the non-oxidizing atmosphere such as nitrogen gas at a temperature about 900° C. In this way, the surface wiring can be formed. On the other hand, in the thin film method, the wiring is directly formed on the surface by means of sputtering. Material used for the wiring may be copper or titanium-nickel-gold which has been conventionally used.

In the manner described above, manufacture of the ceramic substrate including an inner conductor made of copper is completed. When necessary, external leads and a seal ring may be attached to the base board.

According to the present invention, good metalization can be produced even at a temperature, not higher than 1,500° C., that is lower than the conventional metalization temperature for tungsten.

BRIEF DESCRIPTION OF THE DRAWINGS

FIGS. 3(a) to 3(e) are views showing the surface distribution and linear distribution of each component measured by EPMA analysis in a via portion and a portion close to it on the base board provided by Embodiment 2, wherein FIG. 3(a) shows a distribution of the Cu component, FIG. 3(b) shows a distribution of the Al component, FIG. 3(c) shows a distribution of the Si component, FIG. 3(d) shows a distribution of the O component, and FIG. 3(e) shows a distribution of the Y component.

PREFERRED EMBODIMENTS OF THE INVENTION

Embodiment 1

FIGS. 1(a) to 1(f) are views showing the process of Embodiment 1.

Figure 1A:
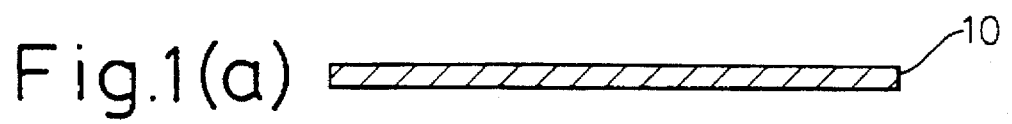
FIGS. 1(a) to 1(f) are views showing the process of Embodiment 1.
Figure 1B:
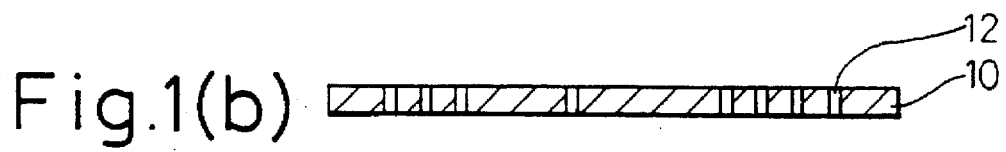
Figure 1C:
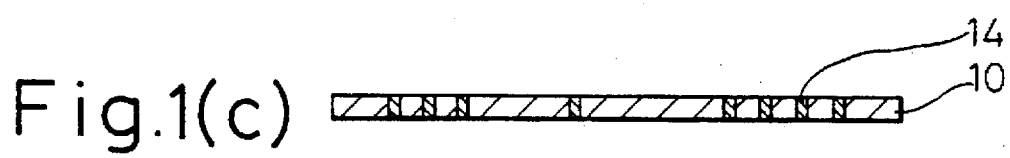
Figure 1D:
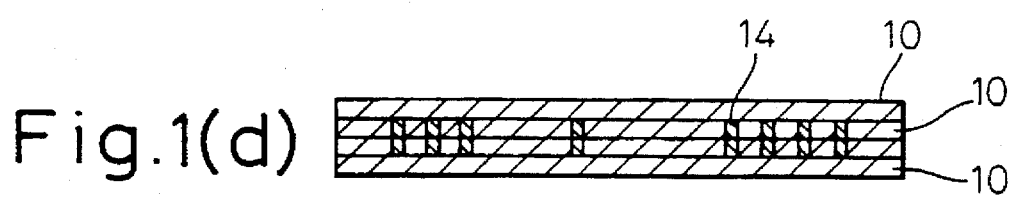

In this embodiment, 92 weight percent of alumina ceramic in which aluminum oxide powder of which the average particle size was 1 μm was mixed with MgO, SiO$_2$ and CaCO$_3$, was formed into a green sheet 10 (shown in FIG. 1(a)). After a large number of through-holes 12, the diameter of which was about 200 μm, had been formed on this green sheet 10 (shown in FIG. 1(b)), copper paste 14 made of copper powder, the average particle size thereof being 1 to 2 μm, was filled into these through-holes 12 and then dried (shown in FIG. 1(c)).

Next, two green sheets 10 charged with the copper paste 14 were laminated, and then on each of the upper and lower surfaces of the laminated body one green sheet 10 on which copper paste was not printed was laminated. The thus obtained laminated body was thermally pressed at the pressure of 200 kgf/cm$^2$ at 60° C. for 5 minutes so that the laminated body was integrated into one body (shown in FIG. 1(d)).

Figure 1E:
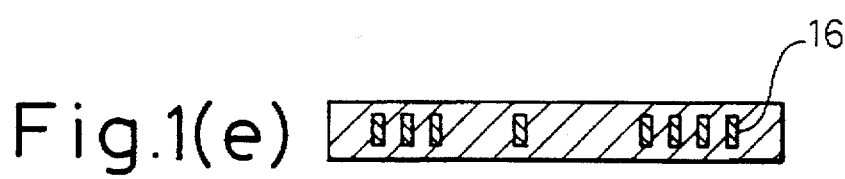
Figure 1F:
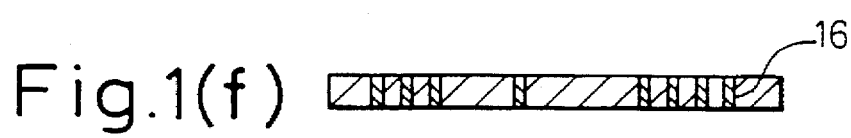

This laminated body was fired in the atmosphere in which ammonium cracked gas and nitrogen gas were mixed at a ratio of 1:2, at a maximum temperature of 1,570° C. for 2 hours (shown in FIG. 1(e)). In the process of firing, in a range of temperature from 150° C. to 1,000° C., the atmosphere was moistened to a dew point of 45° C. so that the organic components were removed. The obtained sintered body was a white uniform compact body, and the via 16 provided in the sintered body was slightly visible. The sintered body was subjected to polishing so that an end surface of the via 16 was exposed to the surface (shown in FIG. 1(f)). The end surface of the via 16 was observed to be the hue of copper, and the surface showed metallic luster. As a result of an investigation for analysing the distribution of components conducted by the EPMA (Electric Probe Micro Analyzer), copper was distributed only on the via-ceramic interface and in the via, and aluminum, oxygen, Si, Mg and Ca were distributed only in the ceramic.

Embodiment 2

In this embodiment, a green sheet was used, the primary component of which was mullite powder, the average particle size of which was about 1 μm, to which 2 weight percent of yttrium oxide, the average particle size of which was about 1 μm, was added as a sintering assistant. Other conditions were the same as those of Embodiment 1. In this way, a green laminated body was made and fired.

Figure 3A:
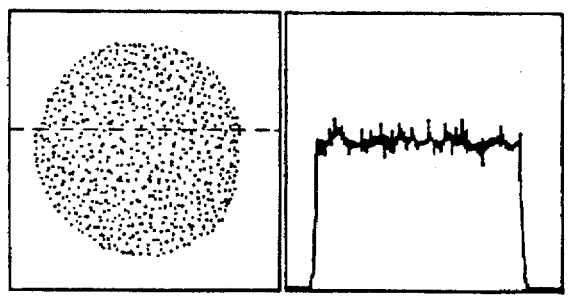
Figure 3B:
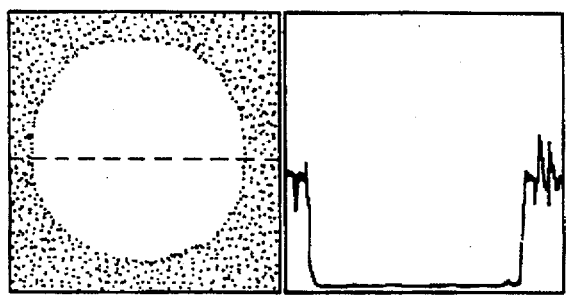
Figure 3C:
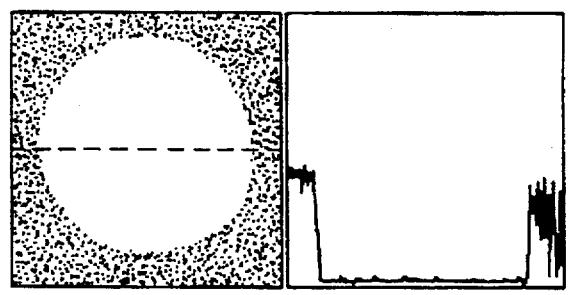
Figure 3D:
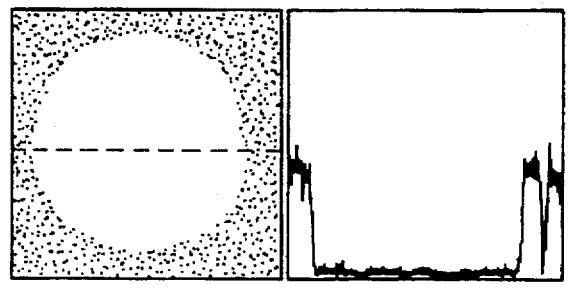
Figure 3E:
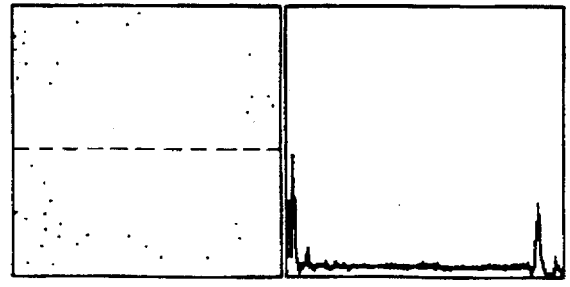

Thus obtained sintered body was a white uniform compressed body. This sintered body was polished so that the via end surface was exposed. As a result of analysis by EPMA conducted on the via end surface, in the same manner as that of Embodiment 1, copper was distributed only in the via portion (shown in FIG. 3(a)). On the other hand, Al (FIG. 3(b)), Si (FIG. 3(c)), O (FIG. 3(d)) and Y (FIG. 3(e)) were distributed only in the ceramics portion.

Embodiment 3

In this embodiment, 96 weight percent of alumina ceramic, in which aluminum oxide powder of which the average particle size was 1 μm, was mixed with MgO, SiO$_2$ and CaCO$_3$ and was formed into a green sheet. After through-holes 12, the diameter of which was about 200 μm, had been formed on this green sheet, copper paste made of copper powder, the average particle size of which was 1 to 2 μm, was charged into these through-holes, and at the same time the plane wiring of which the width was about 240 μm was screen-printed on the green sheet. After that, the green sheet was dried.

The thus obtained green sheets were laminated and integrated so that the copper wiring was not exposed onto the surface in the same manner as that of Embodiment 1. Then the laminated body was fired under the same condition as that of Embodiment 1.

When the obtained sintered body was observed using transmission light, unconnected portions were found in the plane wiring. As a result of the inspection in which the inner conductor was exposed after polishing, disconnection of the wiring was found.

Embodiment 4

FIGS. 2(a) to 2(g) show the process of Embodiment 4.

In this embodiment, 96 weight percent of alumina ceramic, in which aluminum oxide powder of which the average particle size was 1 μm, was mixed with MgO, SiO$_2$ and CaCO$_3$ and was formed into a green sheet 10. Through-holes 12, the diameter of which was about 200 μm, were formed on this green sheet 10 (shown in FIG. 2(a)). Copper paste 14 made of copper powder, the average particle size of which was 1 to 2 µm, to which 5 weight percent of metallic titanium, of which the average particle size was 0.6 µm, was added, was charged into the through-holes 12 (shown in FIG. 2(b)). At the same time the plane wiring of which the width was about 240 µm was screen-printed on the green sheet (shown in FIG. 2(c)).

Figure 2A:
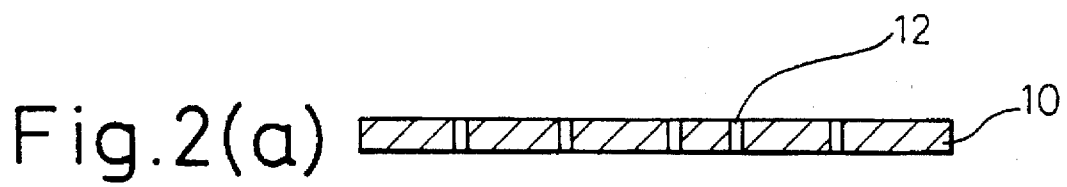
FIGS. 2(a) to 2(g) are views showing the process of Embodiment 4.
Figure 2B:
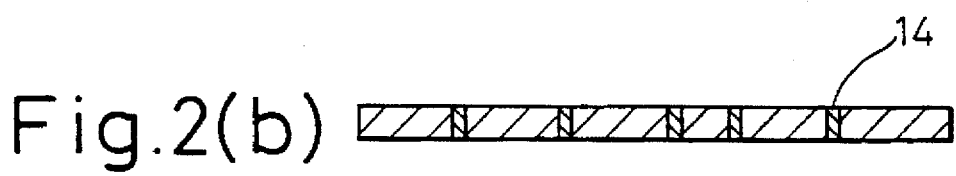
Figure 2C:
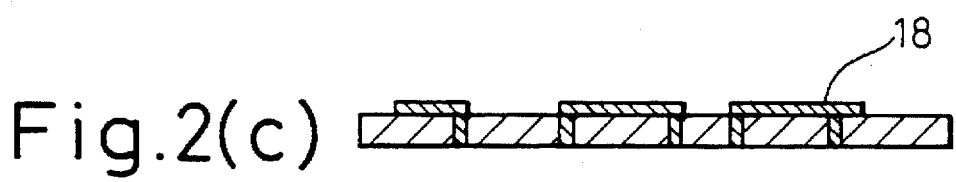
Figure 2D:
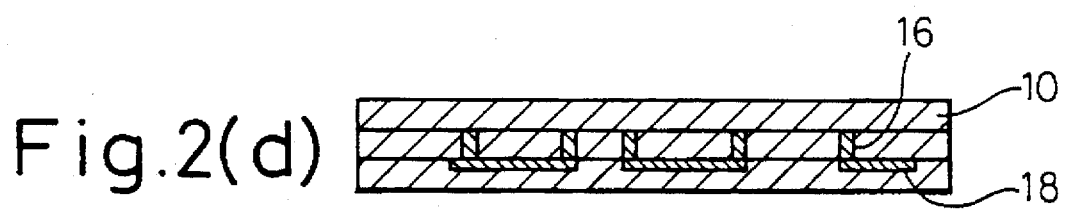
Figure 2E:
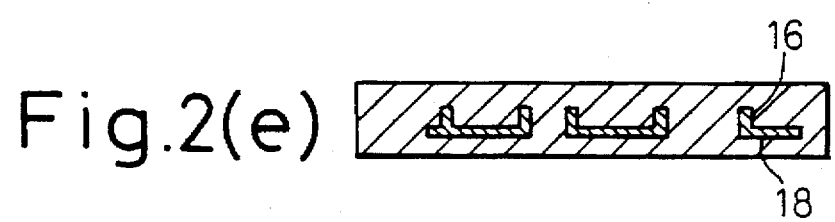

The thus obtained green sheets were laminated and integrated (shown in FIG. 2(d)) so that the copper wiring was not exposed to the surface in the same manner as that of Embodiment 1. Then the laminated body was fired under the same condition as that of Embodiment 1 (shown in FIG. 2(e)).

Figure 2F:
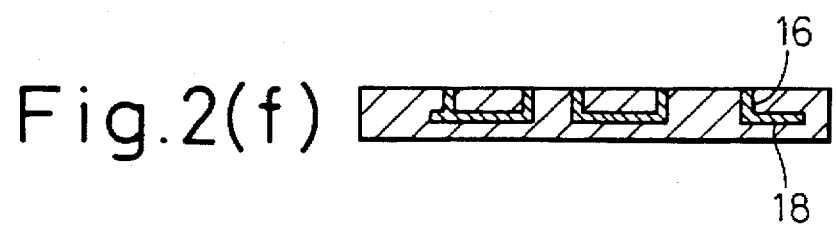
Figure 2G:
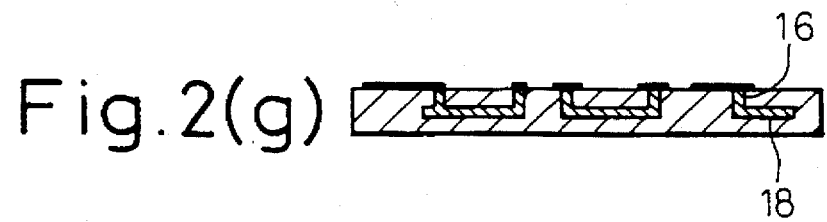

The sintered body was subjected to polishing so that the inner plane surface 18 was exposed (shown in FIG. 2(f)). As a result, disconnection of the wiring was not seen, however, the peripheries of the plane wiring 18 and the via wiring 16 obscurely turned black. The distribution of components on the interface of the via ceramics and in a portion close to the interface was investigated by means of EPMA analysis. As a result of the investigation, in the same manner as Embodiment 1, copper was detected only in the via portion. Although titanium was initially included in the copper paste, it was seldom detected in the via portion after sintering, and it was detected only in the ceramic portion.

By the method of sputtering, thin films of titanium, molybdenum, nickel and gold were formed in this order while the films were connected with the via 16. After pattern etching, it was confirmed that the electric communication through thin film, via, thin film, via, and thin film was maintained (shown in FIG. 2(g)).

Embodiment 5

Figure 4:
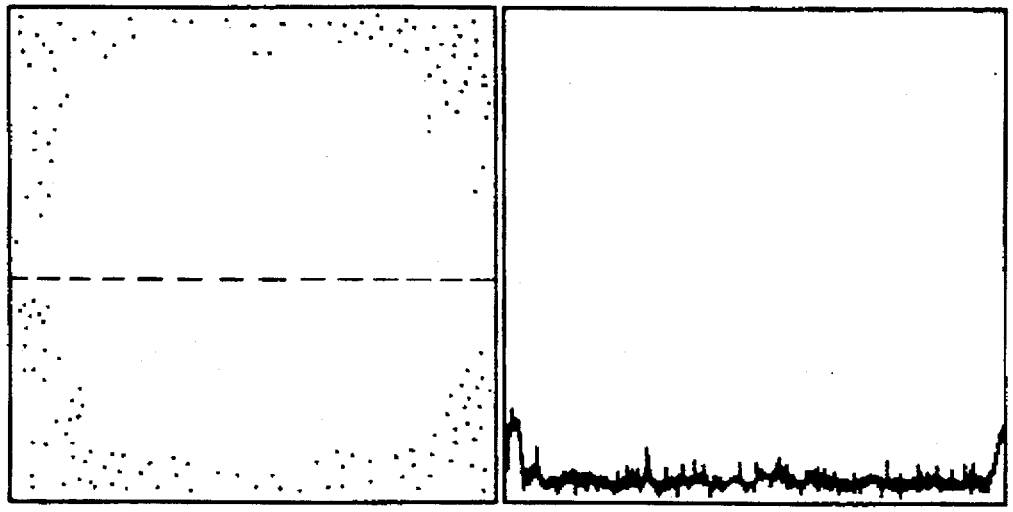
FIG. 4 is a view showing the surface distribution and linear distributions of Ti component measured by EPMA analysis, in a via portion and a portion close to it, on the substrate provided by Embodiment 5.

A sintered body was obtained in the same manner as that of Embodiment 3, wherein a green sheet of mullite ceramic shown in Embodiment 2 was used, and also the copper paste including titanium shown in Embodiment 4 was used. The resulting sintered body was polished so that the inner wiring was exposed. As a result of the inspection, disconnection of the wiring was not found, and in the same manner as Embodiment 4, the peripheries of the plane wiring and the via wiring obscurely turned black. The distribution of components on the interface of the via ceramics and in a portion close to the interface was investigated by means of EPMA analysis. As a result of the investigation, in the same manner as Embodiment 4, copper was detected only in the via portion. As shown in FIG. 4, titanium was seldom detected in the via portion after sintering, and it was detected only in the ceramics portion. Al, Si, O and Y were only found on the ceramics side.

Embodiment 6

A sintered body was obtained in the same manner as that of Embodiment 3, wherein the green sheet of mullite ceramic shown in Embodiment 2 was used, and a copper paste was used, in which copper powder, of which the average particle size was 1 µm, was included, the copper paste including 30 volume percent of tungsten powder, the average particle size of which was 16 µm.

Discontinued portions were not found in the wiring, and coloring was not found around the wiring. However, an end surface of the via wiring exposed on the surface turned white.

Embodiment 7

In this embodiment, a green sheet was used, the primary component of which was mullite powder of which the average particle size was about 2 µm, wherein 31 weight percent of $SiO_2$ powder of which the average particle size was about 10 µm was added, and also, 2 weight percent of yttrium oxide powder of which the average particle size was about 1 µm, was added. Except for the green sheet described above, the same condition as that of Embodiment 1 was adopted to provide a sintered body. In this embodiment, a white uniform compacted body was obtained and copper was distributed only in the via portion.

Embodiment 8

In this embodiment, a green sheet was used, the primary component of which was mullite powder of which the average particle size was about 2 µm, wherein 44% by weight of $SiO_2$ powder, of which the average particle size was about 10 µm, was added, and also 1% by weight of yttrium oxide powder, of which the average particle size was about 1 µm, was added. Except for the maximum firing temperature of 1,510° C., the same condition as that of Embodiment 1 was adopted to provide a sintered body. In this embodiment, a white uniform compacted body was obtained and copper was distributed only in the via portion.

Embodiment 9

In this embodiment, a green sheet was used, which included an inorganic component mixture composed of: 77.3 percent by weight of aluminum powder of which the average particle size was about 2 µm; 17.7 percent by weight of mullite powder of which the average particle size was about 2 µm; and 5 percent by weight of yttrium oxide of which the average particle size was about 1 µm. Except for the different green sheet described above, the same conditions as that of Embodiment 1 were adopted so as to obtain a sintered body. In this embodiment, a white uniform compacted body was obtained, and copper was not distributed on the ceramic side.

Embodiment 10

Through-holes of which the diameter was about 120 µm were formed on the same green sheet as that of Embodiment 1 at intervals of 700 µm. In the same manner as that of Embodiment 1, copper paste was charged, and the green sheets were laminated and firing so as to provide a sintered body.

After the sintered body had been subjected to surface grinding by a surface grinding machine in which fixed abrasive grains were used, it was subjected to lapping by a lapping machine in which free abrasive grains of diamond were used, and then it was polished by a polishing machine. In this way, a surface of Ra=0.1 µm was obtained, onto which the end surface of the via was exposed. On this surface, thin films of titanium, molybdenum, nickel and gold were successively formed by the sputtering method in this order. After pattern etching, it was confirmed that the electric communication through thin film, via, thin film, via, and thin film was maintained.

Conventionally, in a substrate of ceramic oxide of alumina and mullite, the inner wiring was made of a material of high resistance such as tungsten and molybdenum-manganese. According to the present invention, the substrate can be provided in which copper of low specific resistance is used for the inner wiring provided within the ceramic oxide. Therefore, the present invention can provide the following effect. In addition to the mechanical strength which has already been put into practical use, the conductor loss is small, and the signal transmission speed is high. In the case where mullite, mullite-$SiO_2$ and cordierite ceramics are used, the dielectric constant and thermal expansion coefficient can be simultaneously reduced. In this case, even in the ceramics fired at a temperature not higher than 1,500° C. which is too low for the conventional tungsten metalizing technique to be applied, inner wiring of low resistance can be provided. According to the present invention, the conventional manufacturing apparatus for manufacturing alumina and mullite can be used for manufacturing the wiring base board having excellent characteristics described above. Therefore, it is not necessary to introduce new apparatus for manufacturing the base board of the present invention, and the cost can be reduced.

We claim:

1. An oxide ceramic circuit board having an insulating base board made of a ceramic oxide, said board being produced by a process comprising the steps of:

providing via wiring in a first green sheet made of ceramic oxide powder, wherein copper is used in a metallic material for the wiring;

laminating said first green sheet with a second green sheet made of ceramic oxide powder, and integrating said green sheets into a single body so that said wiring is not exposed on an outer surface of the single body;

firing the single body at a temperature higher than the melting point of copper to obtain a sintered body; and polishing or grinding said sintered body so that a portion of the metallic material of the wiring in said sintered body is exposed.

2. An oxide ceramic circuit board having an insulating base board made of a ceramic oxide, said board being produced by a process comprising the steps of:

providing via wiring in a first green sheet made of ceramic oxide powder and having first and second opposing surfaces, wherein copper is used in a metallic material for the wiring;

providing plane wiring on the first surface of the green sheet using the metallic material;

respectively laminating to the first and second surfaces of the first green sheet second and third green sheets made of ceramic oxide powder, and integrating said green sheets into a single body in which the via wiring and plane wiring are not exposed on an outer surface of the single body;

firing the single body at a temperature higher than the melting point of copper to obtain a sintered body; and polishing or grinding said sintered body so that at least a portion of the third green sheet formed on the second surface is removed and a portion of the metallic material of the via wiring in said sintered body is exposed.

* * * * *